(12) United States Patent
Yamazaki et al.

(10) Patent No.: US 6,717,180 B2
(45) Date of Patent: Apr. 6, 2004

(54) SEMICONDUCTOR DEVICE AND METHOD FOR FORMING THE SAME

(75) Inventors: Shunpei Yamazaki, Tokyo (JP); Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/052,371

(22) Filed: Jan. 23, 2002

(65) Prior Publication Data

US 2002/0090770 A1 Jul. 11, 2002

Related U.S. Application Data

(62) Division of application No. 09/360,655, filed on Jul. 26, 1999, now Pat. No. 6,352,883, which is a division of application No. 08/682,414, filed on Jul. 17, 1996, now Pat. No. 5,930,608, which is a division of application No. 08/302,433, filed on Sep. 9, 1994, now abandoned, which is a division of application No. 08/195,050, filed on Feb. 14, 1994, now Pat. No. 5,365,080, which is a continuation of application No. 07/838,887, filed on Feb. 21, 1992, now abandoned.

(30) Foreign Application Priority Data

Feb. 22, 1991 (JP) ................................................ 3-50793

(51) Int. Cl.$^7$ .............................................. H01L 29/04
(52) U.S. Cl. ........................................................ 257/69
(58) Field of Search ............................ 257/57, 66, 67, 257/69, 74, 278; 438/149, 152

(56) References Cited

U.S. PATENT DOCUMENTS

| 4,174,217 A | 11/1979 | Flatley |
| 4,266,986 A | 5/1981 | Benton et al. |
| 4,322,253 A | 3/1982 | Pankove et al. |
| 4,375,993 A | 3/1983 | Mori et al. |
| 4,420,870 A | * 12/1983 | Kimura ...................... 438/162 |
| 4,472,729 A | * 9/1984 | Shibata et al. ................ 257/74 |
| 4,482,395 A | 11/1984 | Hiramoto |
| 4,487,635 A | * 12/1984 | Kugimiya et al. .......... 438/152 |

(List continued on next page.)

FOREIGN PATENT DOCUMENTS

| DE | 36 36 221 C2 | 4/1988 |
| EP | 0 171 509 | 2/1986 |
| EP | 0 301 463 B1 | 2/1989 |
| EP | 0 331 811 | 9/1989 |
| EP | 0 459 836 A2 | 12/1991 |

(List continued on next page.)

OTHER PUBLICATIONS

Application Ser. No. 08/089,650.
K. Sera et al., "High Performance TFT's Fabricated by XeCl Excimer Laser Annealing of Hydrogenated Amorphous–Silicon Film", 8093 Transactions on Electron Devices, vol. 36, No. 12, Dec. 1989, pp. 2868–2872, New York, US.
S. Wolf et al., *Silicon Processing for the VLSI Era Volume 1: Process Technology*, Lattice Press, Sunset Beach, California, (1986) pp. 175, 178–179.

(List continued on next page.)

*Primary Examiner*—Carl Whitehead, Jr.
*Assistant Examiner*—Jennifer M Dolan
(74) *Attorney, Agent, or Firm*—Eric J. Robinson; Robinson Intellectual Property Law Office, P.C.

(57) ABSTRACT

A semiconductor device which is excellent in reliability and electrical characteristics. The semiconductor device is formed on an insulating substrate. A channel region is formed between a source and a drain by the voltage applied to a gate electrode. The channel region, the source, and the drain are fabricated from a semiconductor having a large mobility. The other regions including the portion located under the channel region are fabricated from a semiconductor having a small mobility.

12 Claims, 5 Drawing Sheets

U.S. PATENT DOCUMENTS

| | | | |
|---|---|---|---|
| 4,500,905 A | * | 2/1985 | Shibata ................ 257/74 |
| 4,514,895 A | | 5/1985 | Nishimura |
| 4,523,370 A | | 6/1985 | Sullivan et al. |
| 4,570,175 A | * | 2/1986 | Miyao et al. ........... 257/70 |
| 4,619,034 A | | 10/1986 | Janning |
| 4,657,628 A | * | 4/1987 | Holloway et al. ....... 438/647 |
| 4,659,392 A | | 4/1987 | Vasudev |
| 4,698,486 A | | 10/1987 | Sheets |
| 4,706,376 A | | 11/1987 | Yamazaki et al. |
| 4,719,183 A | | 1/1988 | Maekawa |
| 4,727,044 A | | 2/1988 | Yamazaki |
| 4,743,567 A | | 5/1988 | Pandya et al. |
| 4,768,076 A | | 8/1988 | Aoki et al. |
| 4,769,338 A | | 9/1988 | Ovshinsky et al. |
| 4,775,641 A | | 10/1988 | Duffy et al. |
| 4,797,044 A | | 1/1989 | Velasco |
| 4,799,097 A | | 1/1989 | Szluk et al. |
| 4,885,258 A | | 12/1989 | Ishihara et al. |
| 4,888,305 A | | 12/1989 | Yamazaki et al. |
| 4,894,699 A | * | 1/1990 | Hayashi et al. ........ 257/435 |
| 4,902,637 A | * | 2/1990 | Kondou et al. ......... 438/152 |
| 4,916,504 A | | 4/1990 | Nakahara |
| 4,918,510 A | | 4/1990 | Pfiester |
| 4,959,700 A | | 9/1990 | Yamazaki |
| 5,034,797 A | * | 7/1991 | Yamanaka et al. ....... 257/380 |
| 5,095,347 A | * | 3/1992 | Kirsch ................. 257/57 |
| 5,101,255 A | | 3/1992 | Ishioka et al. |
| 5,162,239 A | | 11/1992 | Winer et al. |
| 5,213,991 A | * | 5/1993 | Inokawa et al. ........ 438/294 |
| 5,236,850 A | | 8/1993 | Zhang |
| 5,247,191 A | | 9/1993 | Yamazaki et al. |
| 5,264,383 A | | 11/1993 | Young |
| 5,278,093 A | | 1/1994 | Yonehara |
| 5,313,076 A | | 5/1994 | Yamazaki et al. |
| 5,350,933 A | * | 9/1994 | Yoshihara ............. 257/69 |
| 5,365,080 A | | 11/1994 | Yamazaki et al. |
| 5,440,150 A | * | 8/1995 | Burns et al. .......... 257/57 |
| 5,514,895 A | | 5/1996 | Kikushima et al. |
| 5,619,044 A | | 4/1997 | Makita et al. |
| 5,930,608 A | | 7/1999 | Yamazaki et al. |
| 5,962,869 A | | 10/1999 | Yamazaki et al. |

FOREIGN PATENT DOCUMENTS

| | | |
|---|---|---|
| JP | 55-008026 | 1/1980 |
| JP | 57-85262 | 5/1982 |
| JP | 58-14524 | 1/1983 |
| JP | 58-164267 | 9/1983 |
| JP | 60-109282 | 6/1985 |
| JP | 60-245172 | 12/1985 |
| JP | 61-135110 | 6/1986 |
| JP | 62-035571 | 2/1987 |
| JP | 62-039067 | 2/1987 |
| JP | 62-254458 | 11/1987 |
| JP | 62-254467 | 11/1987 |
| JP | 63-200572 | 8/1988 |
| JP | 63-250178 | 10/1988 |
| JP | 63-292682 | 11/1988 |
| JP | 02-130912 | 5/1990 |
| JP | 02-228043 | 9/1990 |
| JP | 2-272750 | 11/1990 |

OTHER PUBLICATIONS

Wolf et al., Silicon Processing for the VLSI Era, vol. 2, Process Integration, Lattice Press, 1990, pp. 75–76.

"XeCl Excimer Laser Annealing Used To Fabricate Poly–Si TFTs", by T. Sameshima and S. Usui, Sony Corporation Research Center, Yokohama 240, Japan.

Sameshima, pp. 1789–1793, Japanese Journal of Applied Physics, vol. 28, No. 10.

Sameshima et al., pp. 435–440, Materials Research Society Symposia Proceedings, vol. 71.

* cited by examiner

SEMICONDUCTOR DEVICE AND METHOD FOR FORMING THE SAME

RELATED APPLICATIONS

This application is a divisional of U.S. patent application Ser. No. 09/360,655, filed Jul. 26, 1999, now U.S. Pat. No. 6,352,883; which is a divisional of U.S. patent application Ser. No. 08/682,414, filed Jul. 17, 1996, now U.S. Pat. No. 5,930,608; which is a divisional of U.S. patent application Ser. No. 08/302,433, filed Sep. 9, 1994, now abandoned; which is a divisional of U.S. patent application Ser. No. 08/195,050, filed Feb. 14, 1994, now U.S. Pat. No. 5,365,080; which is a continuation of U.S. patent application Ser. No. 07/838,887, filed Feb. 21, 1992, now abandoned.

FIELD OF THE INVENTION

The present invention relates to a semiconductor device, e.g. a thin-film field-effect transistor (TFT), and also to a method for forming it. TFTs are used in VLSIs, liquid-crystal display drivers, and other devices.

BACKGROUND OF THE INVENTION

Figure 1:
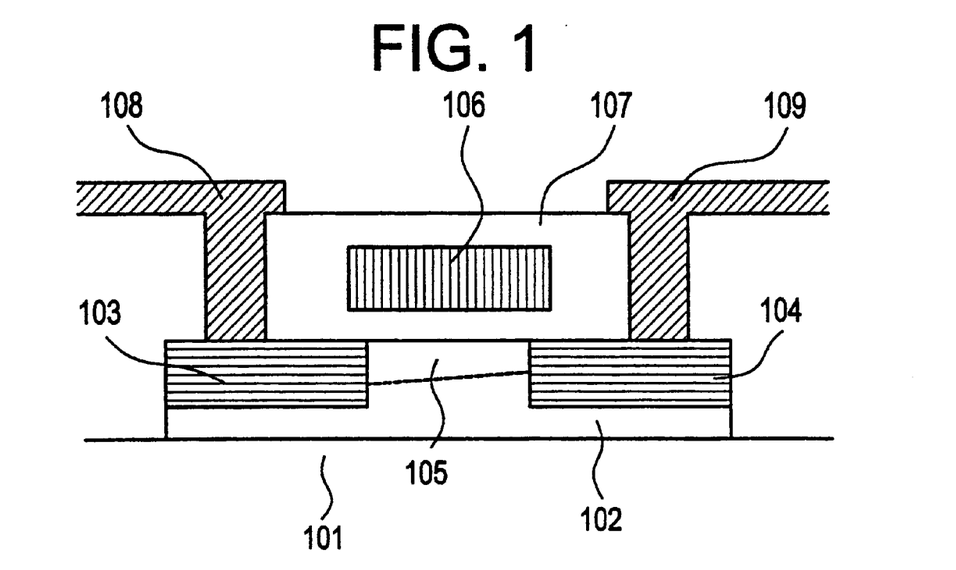
FIG. 1 is a cross-sectional view of a known, coplanar thin-film field-effect transistor (TFT)

Various TFT structures and various methods for fabricating them have been heretofore proposed. A fundamental TFT structure is shown in FIG. 1. This is called the coplanar type and comprises an insulating substrate 101 on which a semiconductor layer 102 is formed. Where the TFT is required to operate at a high speed, a single-crystal semiconductor or polycrystalline semiconductor is used. Similarly to ordinary insulated-gate semiconductor devices, a source region 103 and a drain region 104 which are doped with a dopant to enhance their conductivity are formed by self-alignment, using a gate electrode 106 as a mask. A channel formation region 105 is formed between the source and drain regions. The whole device is coated with an interlayer insulating film 107. The source and drain regions are provided with holes to permit formation of a source electrode 108 and a drain electrode 109. Generally, the depth of the source and drain regions is equal to or less than the thickness of the semiconductor layer 102. This device is not so designed that the crystallinity of those portions of the semiconductor layer which are close to the gate-insulating film is different from the crystallinity of those portions of the semiconductor layer which are close to the insulating substrate.

In the normal TFT structure shown in FIG. 1, the semiconductor layer consisting of a single crystal or polycrystals and showing poor crystallinity is used as the semiconductor layer containing the channel formation region. The semiconductor layer 102 has many defects and, therefore, malfunctions often occur. Slow leakage is a typical example of such malfunction.

Figure 3:
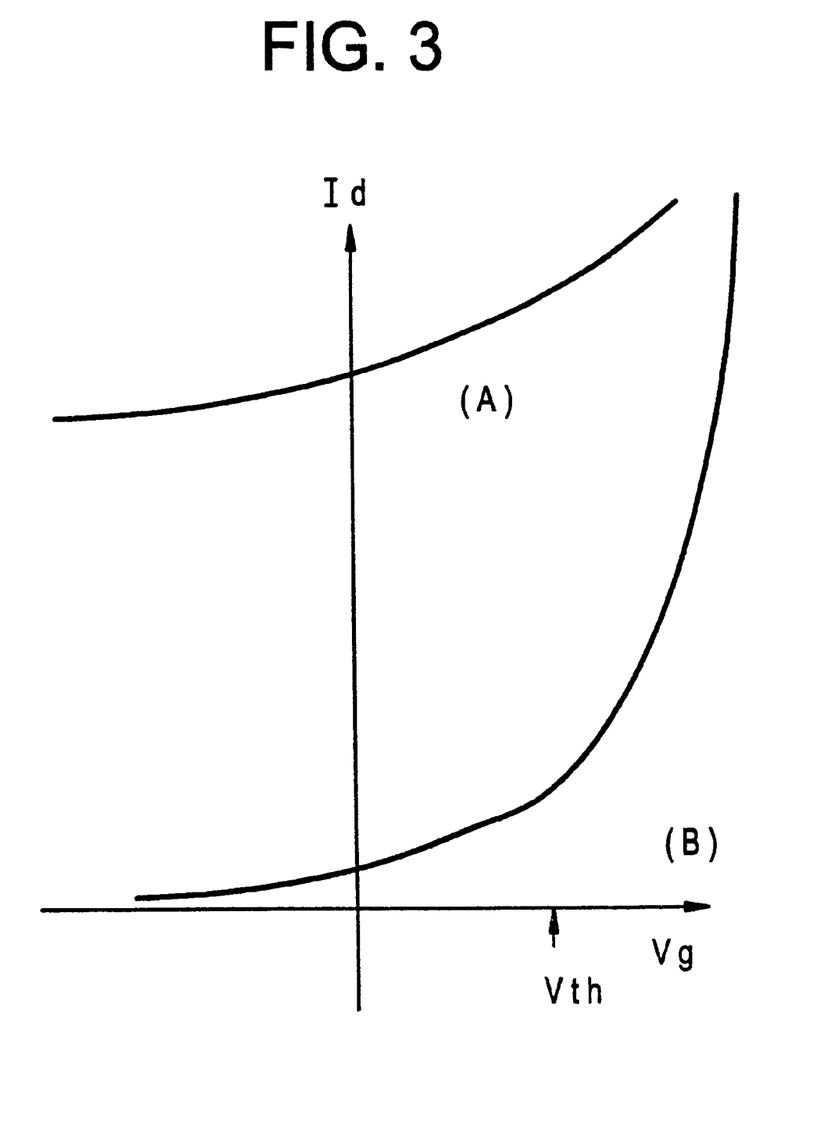
FIG. 3 is a graph showing the relation (A) of the drain current (Id) to the gate voltage (Vg) of the known TFT shown in FIG. 1, as well as the relation (B) of the drain current (Id) to the gate voltage (Vg) of the novel TFT shown in FIG. 2.

That is, where the gate voltage is so low that no channel should be formed, i.e., the gate voltage is lower than the threshold voltage Vth as shown in FIG. 3(B), the relation of the drain current Id to the gate voltage Vg is given by smooth curve A in FIG. 3. Under this condition, i.e., the gate voltage is lower than the threshold voltage Vth, a current flows between the source and drain. It follows that it is substantially impossible to control the drain current by the gate voltage. The spontaneously flowing current at voltages lower than the threshold voltage Vth is known as punch-through current.

This punch-through current flows between the source and drain through a passage that is considerably deeper than the channel surface. Therefore, it is possible to control the punch-through current by increasing the resistance of this passage. However, any feasible TFT having this structure has not been proposed.

SUMMARY OF THE INVENTION

It is an object of the present invention to provide a semiconductor device which is free of the foregoing problems including slow leakage.

It is another object of the invention to provide a method for forming such a semiconductor device.

A semiconductor device according to the invention has a semiconductor layer consisting of two portions which differ in crystallinity. One portion has a larger carrier mobility and consists of a semiconductor having a higher crystallinity, e.g. a single crystal or polycrystal semiconductor. The other portion has a smaller carrier mobility and consists of a semiconductor having a lower crystallinity, e.g. an amorphous, semi-amorphous, or microcrystalline semiconductor. The higher crystallinity portion is provided close to a gate insulator of the semiconductor device and the lower crystallinity portion is provided distant from the gate insulator. In this structure, for example, only the shallower portion which will become a channel formation region is crystallized. This is considerably effective in preventing slow leakage.

The fabrication of this semiconductor device starts with formation of a semiconductor layer that is not a single crystal. The surface of this semiconductor layer is illuminated with a first laser radiation or other similar intense radiation to change the semiconductor layer into a single crystal or polycrystals. An insulating film which will become a gate-insulating film is formed. A semiconductor coating is formed only on selected portions of the surface of the insulating film to create a gate electrode. Using this gate electrode as a mask, the laminate is illuminated with a second laser radiation or other similar intense radiation having a wavelength longer than that of the first laser radiation or other similar intense radiation to change the laminate into a single crystal or polycrystals except for both gate electrode and portion underlying the gate.

Other objects and features of the invention will appear in the course of the description thereof which follows.

DETAILED DESCRIPTION OF THE INVENTION

Figure 2:
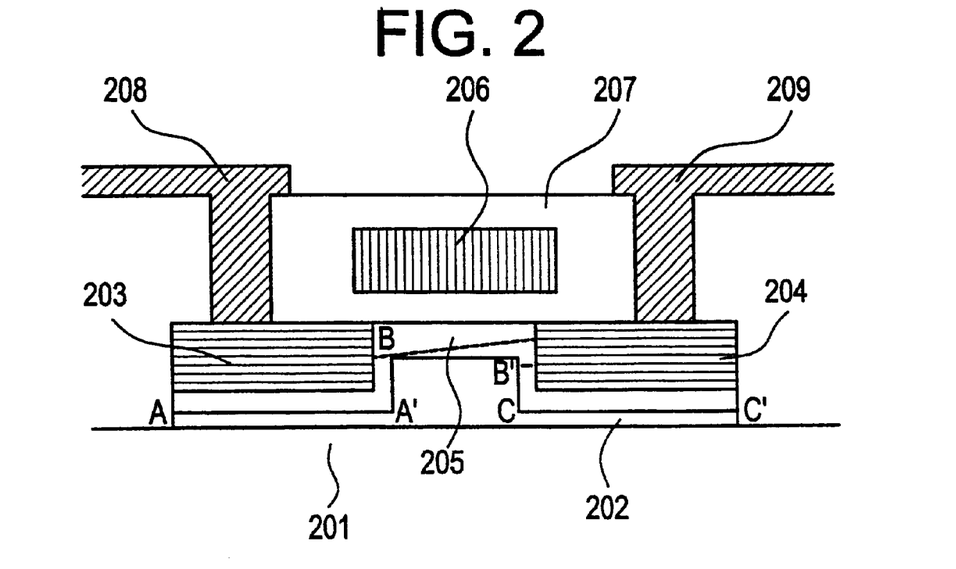
FIG. 2 is a cross-sectional view of a thin-film field-effect transistor (TFT) according to the invention.

Referring to FIG. 2, there is shown the fundamental structure of a thin-film field-effect transistor (TFT) according to the invention. In the conventional TFT structure shown in FIG. 1, the semiconductor layer 102 is uniformly changed into a single crystal or polycrystals. The novel TFT structure shown in FIG. 2 is similar to this conventional structure shown in FIG. 1 except that the crystalline semiconductor layer 102 is replaced by a semiconductor layer 202 consisting of two portions differing in crystallinity. Specifically, the portion located over line A-A'-B-B'-C-C' is a single-crystal semiconductor or polycrystalline semiconductor which has a large carrier mobility and a high degree of crystallinity. The lower portion is made of an amorphous, semi-amorphous, or microcrystalline semiconductor having a lower carrier mobility.

This structure is characterized in that only the shallower portion which will become a channel formation region is crystallized. As a result, slow leakage is considerably avoided, because punch-through current causing slow leakage flows through a passage that is deeper than the gate-insulating film, and because this passage is made of a highly resistive material. Hence, little slow-leakage current flows through the deep passage. Accordingly, more current can be controlled by the channel formation region. The characteristic of this TFT is indicated by curve B in FIG. 3.

In FIG. 2, the semiconductor portion forming a source region 203 and a drain region 204 is not always required to be formed simultaneously with the semiconductor portion forming a channel formation region 205. Also, they need not be identical in crystallinity. For example, the semiconductor material forming the channel formation region is substantially a single crystal, while the semiconductor material forming the source and drain regions is polycrystalline. It is to be noted that the present invention is not limited to a semiconductor device comprising two semiconductor materials. The first material forms the source, drain, and channel formation region, is highly crystalline, and has a large mobility. One of the technical concepts of the invention is that the resistance of the semiconductor layer underlying the channel formation region is made larger than that of the channel formation region. Consequently, it is essential that the two materials have different mobilities.

Therefore, the source, drain, and channel formation region may be made of a substantially single crystal. The other region may be made of a polycrystalline material having a smaller mobility and grain diameters of 10–100 nm. As a further example, the source, drain, and channel formation region are made of a microcrystalline or semi-amorphous material having grain diameters of 1–10 nm. The other region is made of an amorphous material having a smaller mobility.

This novel TFT is fabricated in the manner described now by referring to FIG. 4. A semiconductor coating 402, e.g. a non-single crystal semiconductor coating, is formed on selected portions of the surface of a substrate 401 in the same manner as in the conventional process. This coating 402 will become the region other than the source, drain, and channel formation region and so it is necessary that the material of this coating 402 have a mobility smaller than that of the material of the source, drain, and channel formation region that will be formed later. This condition is shown in FIG. 4(A).

Figure 4A:
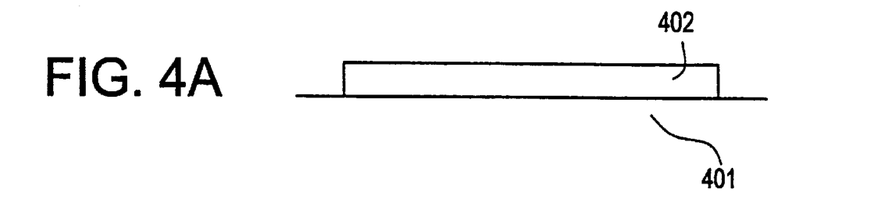
FIGS. 4(A) to 4(F) are cross-sectional views showing a method for forming a thin-film field-effect transistor according to the invention.
Figure 4B:
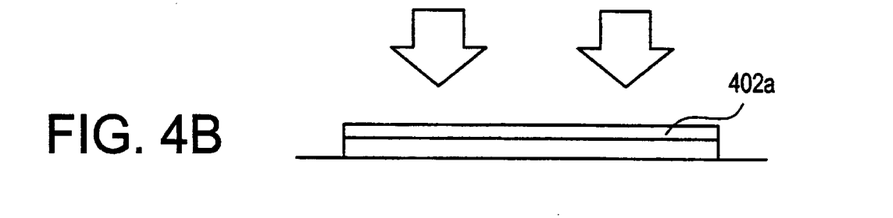

Then, that portion of the semiconductor coating 402 which is close to the surface is changed (crystallized) into either polycrystals or a single crystal by laser annealing, flash lamp annealing, or other similar method, e.g. by irradiation of an ultraviolet ray. In this way, a region 402a having a large mobility is formed. This condition is shown in FIG. 4(B).

Figure 4C:
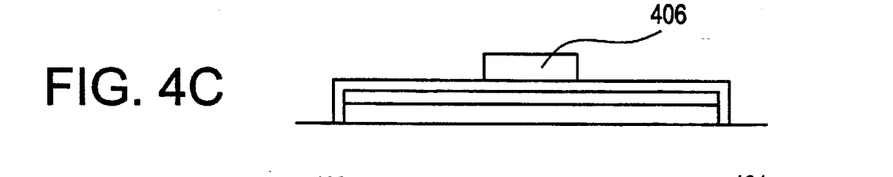

A thin insulating film which will become a gate-insulating film is formed on the surface of the semiconductor layer. A gate electrode 406 is formed on it from a metal (e.g., aluminum, molybdenum, or tungsten), a semiconductor material (e.g., silicon, germanium, or gallium arsenide), a lamination thereof, or an alloy thereof. The gate electrode fabricated in this way might be damaged by subsequent ion implantation or annealing. Therefore, if necessary, a protective film of a photoresist or the like is formed on the gate electrode. This condition is shown in FIG. 4(C).

Figure 4D:
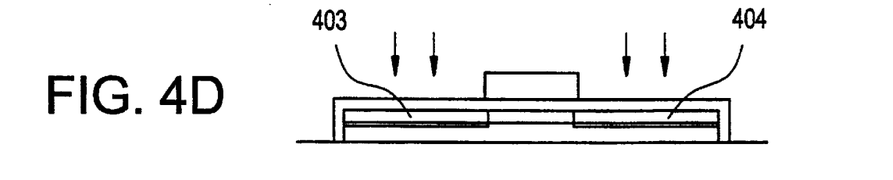

Using the gate electrode as a mask, dopant ions are then implanted into the semiconductor layer 402a and the underlying semiconductor layer, for example, by self-aligned ion implantation to form doped regions 403 and 404 which will become source and drain regions, respectively. In many cases, the semiconductor region 402a excluding the portion located under the gate electrode 406 is made amorphous by the implantation of the dopant ions. Again, the mobility is low. This condition is shown in FIG. 4(D).

Figure 4E:
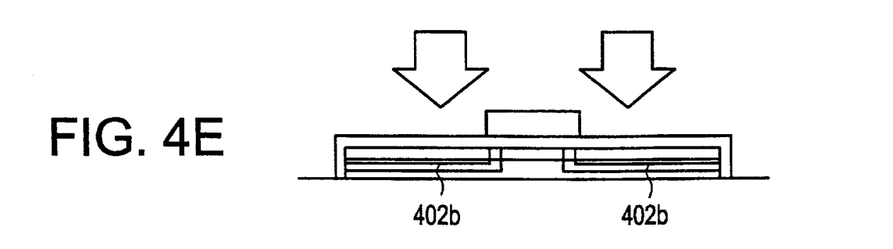
Figure 4F:
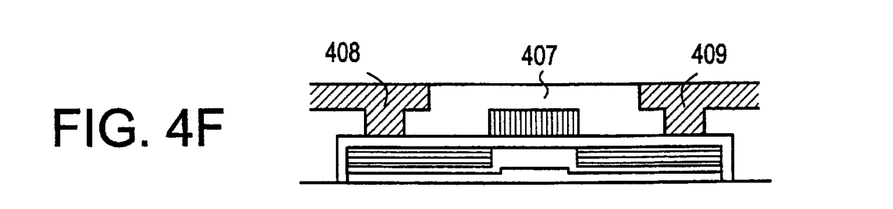

Subsequently, using the gate electrode as a mask, the semiconductor coating 402a and the underlying semiconductor layer 402 are changed (crystallized) except for a portion under the gate electrode into a single crystal or polycrystals by laser annealing, flash lamp annealing, or other similar method, e.g. by irradiation of a visible light or an infrared light. In this way, regions 402b having a large mobility are formed. At this time, it is necessary that the large-mobility regions 402b which are obtained by the present crystallization step be formed deeper than the large-mobility region 402a that is formed by the first crystallization step. However, no limitations are imposed on the positional relation between the distribution of the dopant ions lodged by the ion implantation or other method and the distributions of the large-mobility semiconductor portions. The dopant ions are allowed to exist in shallower positions than the crystallized large-mobility portions as shown in FIG. 4. The reverse structure is also permitted. In this manner, the condition shown in FIG. 4(E) is obtained. In FIG. 4(E), an underside of at least one of the source and drain regions is below the channel formation region. Finally, an interlayer insulating film 407, a source electrode 408, and a drain electrode 409 are formed in the same way as in the conventional process. As a result, a TFT is completed. This condition is shown in FIG. 4(F).

In the production method described above, two annealing steps are employed. As mentioned above, in order to form two large-mobility regions by annealing, the anneal time is made different among the two annealing steps. Where laser annealing is utilized, different wavelengths of laser radiation are used, or different pulse durations of pulsed laser are used. Normal thermal annealing is not desired, because crystal grows isotropically, making it substantially impossible to control the direction of the depth. However, rapid thermal annealing (RTA) can be used.

In the case of laser annealing, an excimer laser, a YAG laser, argon ion laser, $CO_2$ laser, or other similar laser can be employed. As an example, in the first laser annealing step, a relatively shallow region 5 to 100 nm deep from the surface is crystallized, using an excimer laser radiation which penetrates shallowly the semiconductor material such as silicon. In the second laser annealing step, a YAG laser radiation which penetrates relatively deeply the semiconductor material is used to crystallize it up to a relatively deep portion 50 to 1000 nm deep from the surface. In this way, a semiconductor region which has a shape required by the invention and a large mobility can be formed.

EXAMPLE 1

Example 1 of the invention is now described by referring to FIG. 5. A hydrogenated amorphous silicon coating was formed on a quartz substrate 501 by glow-discharge plasma-assisted CVD. This coating was selectively removed to form a semiconductor coating 502 having a thickness of 100 to 1000 nm, e.g., 200 nm. The number of oxygen atoms in the semiconductor film per cm$^3$ was set less than $10^{19}$, preferably less than $10^{17}$, to prevent collection of oxygen atoms at the grain boundaries of polysilicon in the subsequent laser annealing step; otherwise a decrease in the mobility would occur. Boron ions were implanted into this coating at a dose of $10^{10}$ to $10^{11}$ ions/cm$^2$. This condition is shown in FIG. 5(A).

Figure 5A:
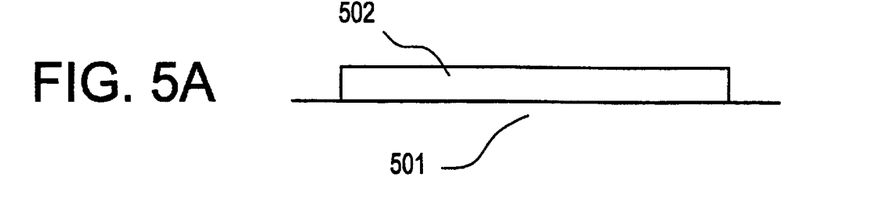
FIGS. 5(A) to 5(F) are cross-sectional views showing another method for forming a thin-film field-effect transistor according to the invention.
Figure 5B:
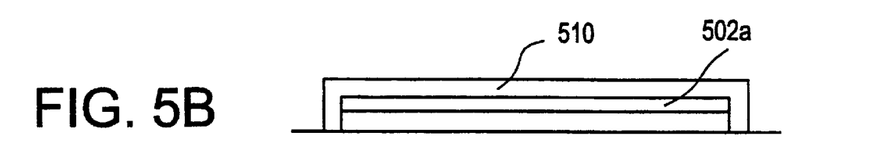

A film 510 of silicon oxide or silicon nitride having a thickness of 10 to 100 nm, e.g., 50 nm, was formed on the surface of the semiconductor coating 502 by glow-discharge plasma-assisted CVD or photo-assisted CVD. The laminate was placed within a high-vacuum chamber which was evacuated to lower than $10^{-6}$ torr and irradiated with pulsed light emitted by a KrF excimer laser to crystallize the laminate. The energy density per pulse was 10 to 500 mJ/cm$^2$, e.g., 100 mJ/cm$^2$. The wavelength was 248 nm, and the pulse duration was 10 nm. In this way, a polycrystalline layer 502a was derived. The crystallization occurred up to the depth of about 30 nm. The grain diameters of the polycrystals ranged from 10 to 50 nm. It was thought that the existence of the boron ions previously implanted made this region a p-type semiconductor. The Hall mobility of this semiconductor fabricated by the same method was 10 to 30 cm$^2$/V·sec, and the electron mobility was 20 to 500 cm$^2$/V·sec. This condition is shown in FIG. 5(B).

Figure 5C:
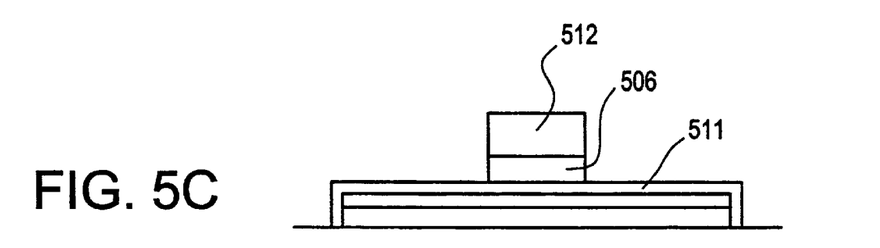

Subsequently, the previously formed film of silicon oxide or silicon nitride was removed. Then, a silicon oxide coating 511 which would become a gate-insulating film was formed by a similar method or thermal oxidation. The thickness of this coating 511 was 10 to 30 nm, e.g., 15 nm. A film of aluminum having a thickness of 100 to 1000 nm, e.g., 300 nm, was formed over the whole laminate by sputtering, vacuum evaporation, metallo-organic chemical vapor deposition, or other known film formation techniques. The aluminum film was selectively removed to create a gate electrode 506 having a width of 200 nm to 10 µm, e.g., 1 µm. At this time, the photoresist 512 having a thickness of about 2 µm and used in the previous etching step was left behind. Fluorine was added to the gate-insulating film at a dose of the order of 100 ppm to prevent the gate-insulating film from being damaged by hot electrons or the like. This condition is shown in FIG. 5(C).

Figure 5D:
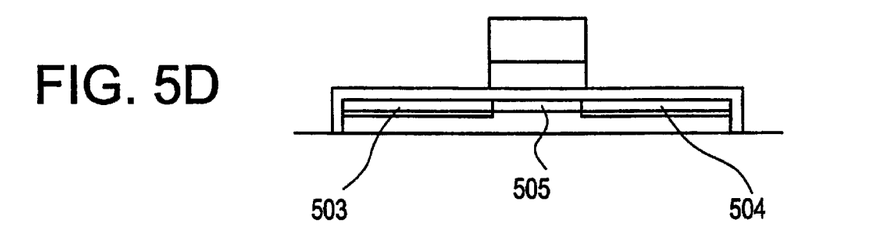

Thereafter, phosphorus ions were implanted at a dose of $10^{15}$ to $10^{17}$ ions/cm$^2$. However, because of the presence of the photoresist and the gate electrode, the channel formation region located under the gate electrode was not implanted with the ions. In this way, a region 503 which would become a source, a region 504 which would become a drain, and a channel formation region 505 were obtained, as shown in FIG. 5(D).

Figure 5E:
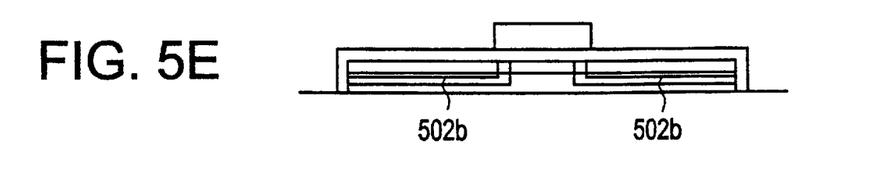

The laminate was laser annealed by irradiation of a continuous-wave argon ion laser beam having a power density of 1 to 1000 kW/cm$^2$, e.g., 20 kW/cm$^2$. With the gate electrode as a mask, regions 502b including the source and drain regions were changed into polycrystals. At this time, the depth of the region 502b was 200 to 500 nm. The depth of the region 502b could be varied slightly by -controlling the number of the pulses of the laser and the output. This laser annealing evaporated a larger portion of the remaining resist, but the underlying gate electrode was not affected greatly. This condition is shown in FIG. 5(E).

Figure 5F:
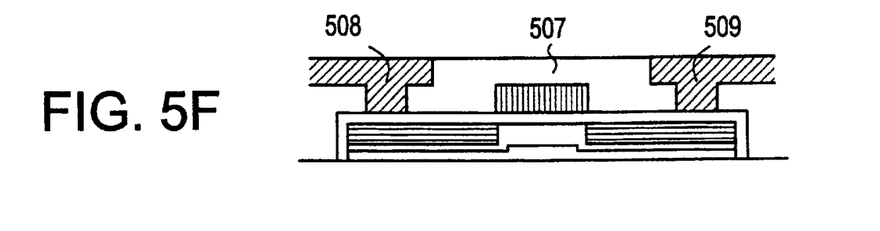

Finally, a silicon oxide coating 507 having a thickness of 0.5 to 3 µm, e.g., 1 µm, was formed by glow-discharge plasma-assisted CVD or other similar method. Holes were formed in this coating. An aluminum film was formed on selected portions of the surface of the coating 507 to create a source electrode 508 and a drain electrode 509. This condition is shown in FIG. 5(F).

In the present example, an aluminum gate self-aligning type MOSFET was obtained. A silicon gate self-aligning type MOSFET can be derived by replacing the gate electrode with polysilicon obtained by low-pressure CVD. Furthermore, devices of similar structure can be fabricated by using an alloy of aluminum and silicon, a metal such as molybdenum or tungsten, or an alloy containing such a metal, instead of the aluminum used in the present example. Especially, where thermal oxidation is not used for the formation of the gate-insulating film in the present example of process, the maximum temperature is below 300° C. In addition, lower temperatures below 150° C. are also possible. This greatly facilitates combination with liquid crystal materials or other organic functional materials which are not resistant to heat. Even if thermal oxidation is used to form the gate-insulating film, the maximum temperature in the subsequent process can be suppressed below 300° C. Therefore, an aluminum gate electrode can be formed as in the illustrated example. Consequently, an aluminum coating can be used to create the gate electrode and conductive interconnects in other locations than the gate electrode.

EXAMPLE 2

Figure 6A:
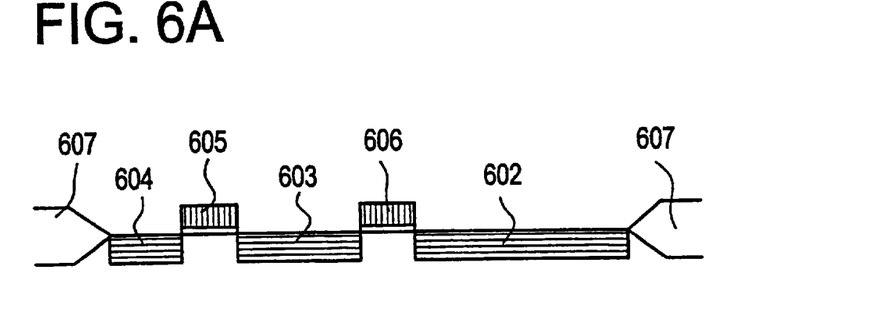
FIG. 6(A) is a cross-sectional view of two conventional insulated-gate FETs.

FIG. 6 shows an example of combination of TFTs according to the invention and a monolithic integrated circuit. FIG. 6(A) shows two insulated-gate FETs formed in a region surrounded by a field insulator 607 on a p-type single crystal of silicon 601. Each of n-type semiconductor regions 602–604 functions as a source or drain. Gate electrodes 605 and 606 consist of polysilicon.

Figure 6B:
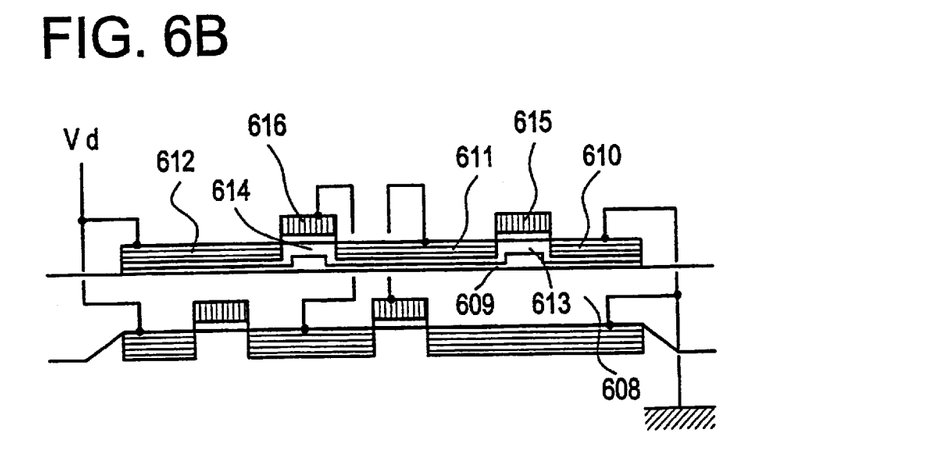
FIG. 6(B) is a cross-sectional view of a semiconductor device comprising the conventional insulated-gate FETs shown in FIG. 6(A) and TFTs formed on it, the TFTs being formed in accordance with the present invention.

Referring to FIG. 6(B), a flat interlayer insulating film 608 is formed on the semiconductor device shown in FIG. 6(A). TFTs according to the invention are formed on the insulating film 608. Conductive interconnects are formed between the FETs. P-type semiconductor regions 610–612 are formed on an n-type semiconductor layer 609. Each of the p-type semiconductor regions 610–612 acts as a source or drain. Gate electrodes 615 and 616 are formed over channel regions 613 and 614, respectively.

The channel regions 613 and 614 do not register (overlap) with the gate electrodes 605 and 606 to prevent the TFTs formed on the FETs from being caused to malfunction by the voltages applied to the gate electrodes of the FETs formed on the semiconductor substrate consisting of a single crystal. In this structure, conductive interconnects between the gate electrode 616 and the n-type semiconductor region 603 and conductive interconnects between the gate electrode 606 and the p-type semiconductor region can be quite easily formed, because the gate electrode 616 is located just above the n-type semiconductor region 603, and because the gate electrode 606 exists just under the p-type semiconductor region 611. Where the gate electrode 616 is made of aluminum, these interconnects and the gate electrode 616 can be fabricated from the same material at the same time. That is, this can be easily achieved by the method of Example 1.

Figure 6C:
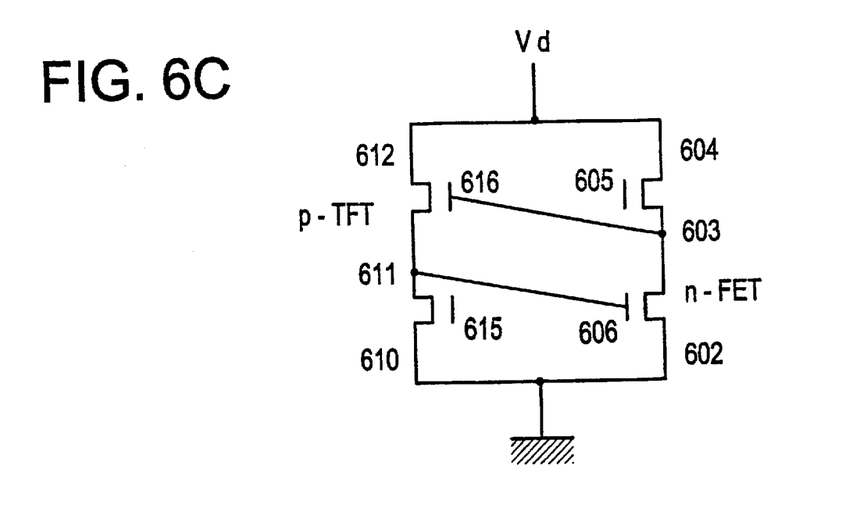
FIG. 6(C) is a circuit diagram of the semiconductor device shown in FIG. 6(B).

FIG. 6(C) is a circuit diagram of the semiconductor device shown in FIG. 6(B). This circuit is used in the memories of fully static CMOS RAMs. In the present example, NMOS devices are used as the FETs, while PMOS devices are employed as the TFTs. Since it is difficult to increase the Hall mobilities of TFTs, the characteristics of the device can be improved by using PMOS and NMOS devices as the FETs and the TFTs, respectively, in a reverse relation to the illustrated example, so as to average out their mobilities.

The present invention permits mass production of reliable TFTs free from slow leakage. In the illustrated embodiments, silicon is used as a semiconductor material. Instead, compound semiconductors such as gallium arsenide, gallium phosphide, and silicon-germanium alloy may be used. Also, germanium may be used alone. In addition, as pointed out in Example 2, a stacked three-dimensional IC can be fabricated by combining the novel TFTs with a monolithic IC formed on a semiconductor substrate of a single crystal. Especially, in the case of the combination with a monolithic IC, high-mobility semiconductor devices are needed. Additionally, TFTs producing no slow leakage are necessitated. In the novel TFTs, slow leakage is suppressed greatly, and the current rises well at the threshold voltage. Hence the novel TFTs satisfy the above-described requirements. Especially, where these are used as static RAM devices, it is necessary that the drain current is extremely small when no voltage or a reverse voltage is applied to the gate electrodes, for reducing power consumption. The novel TFTs are especially well suited to these applications.

The foregoing description of preferred embodiments has been presented for purposes of illustration and description. It is not intended to be exhaustive or to limit the invention to the precise form described, and obviously many modifications and variations are possible in light of the above teaching. The embodiments were chosen in order to explain most clearly the principles of the invention and its practical application thereby to enable others in the art to utilize most effectively the invention in various embodiments and with various modifications as are suited to the particular use contemplated. An example of such modifications is as follows.

In the case where the gate electrode is made of a semiconductor, the semiconductor of the gate electrode can be crystallized at the same time as the crystallization of the semiconductor portions including the source and drain regions.

What is claimed is:

1. A three-dimensional IC comprising:
   at least a first FET comprising a first channel and a first gate, and a second FET comprising a second channel and a second gate on a single crystal substrate;
   an insulating film over the first FET and the second FET; and
   at least a first TFT comprising a first gate electrode and a second TFT comprising a second gate electrode on the insulating film,
   wherein the first channel region and the second channel region are not overlapped with either the first gate electrode of the first TFT or the second gate electrode of the second TFT, and
   wherein the first gate electrode of the first TFT is electrically connected to an impurity region of the first and second FETs, and the second gate of the second FET is electrically connected to an impurity region of the first and second TFTs.

2. A three-dimensional IC according to claim 1, wherein each of the first FET and the second FET is an NMOS, and each of the first TFT and the second TFT is a PMOS.

3. A three-dimensional IC according to claim 1, wherein a channel region of each of the first TFT and the second TFT comprises a single crystal semiconductor, and a source region and a drain region of each of the first TFT and the second TFT comprises polycrystalline semiconductor.

4. A three-dimensional IC comprising:
   at least a first FET and a second FET on a single crystal substrate;
   an insulating film on the first FET and the second FET; and
   at least a first TFT and a second TFT on the insulating film,
   wherein a first gate electrode of the first TFT is connected to a first semiconductor region between the first FET and the second FET, and a second gate electrode of the second FET is connected to a second semiconductor region between the first TFT and the second TFT, and
   wherein the first gate electrode of the first TFT overlaps the first semiconductor region between the first and second FETs, and the second semiconductor region between the first TFT and the second TFT overlaps the second gate electrode of the second FET.

5. A three-dimensional IC according to claim 4, wherein the first semiconductor region is n-type and the second semiconductor region is p-type.

6. A three-dimensional IC according to claim 4, wherein a channel region of each of the first TFT and the second TFT comprises a single crystal semiconductor, and a source region and a drain region of each of the first TFT and the second TFT comprises polycrystalline semiconductor.

7. A three-dimensional IC comprising:
   at least a first FET comprising a first channel and a first gate, and a second FET comprising a second channel and a second gate;
   an insulating film over the first and second FETs;
   at least a first TFT comprising a first gate electrode and a second TFT comprising a second gate electrode over the first FET and the second FET;
   wherein the first channel region and the second channel region are not overlapped with either the first gate electrode of the first TFT or the second gate electrode of the second TFT,
   wherein the first gate electrode of the first TFT is electrically connected to an impurity region of the first and second FETs, and the second gate of the second FET is electrically connected to an impurity region of the first and second TFTs, and
   wherein the second gate of the second FET is located below said impurity region of the first and second TFTs, and said impurity region of the first and second FETs is located below the first channel of the first FET.

8. A three-dimensional IC according to claim 7, wherein each of the first FET and the second FET is an NMOS, and each of the first TFT and the second TFT is a PMOS.

9. A three-dimensional IC according to claim 7, wherein a channel region of each of the first TFT and the second TFT comprises a single crystal semiconductor, and a source region and a drain region of each of the first TFT and the second TFT comprises polycrystalline semiconductor.

10. A three-dimensional IC comprising:

at least a first FET and a second FET;

an insulating film over the first and second FETs;

at least a first TFT and a second TFT over the first FET and the second FET, wherein a first gate electrode of the first TFT is connected to a first semiconductor region between the first FET and the second FET, and a second gate electrode of the second FET is connected to a second semiconductor region between the first TFT and the second TFT, wherein the first gate electrode of the first TFT overlaps the first semiconductor region between the first and second FETs, and the second semiconductor region between the first TFT and the second TFT overlaps the second gate electrode of the second FET, and wherein the second gate electrode of the second FET is not overlapped by either a first channel region of the first TFT or a second channel region of the second TFT.

11. A three-dimensional IC according to claim 10, wherein the first semiconductor region is n-type and the second semiconductor region is p-type.

12. A three-dimensional IC according to claim 10, wherein a channel region of each of the first TFT and the second TFT comprises a single crystal semiconductor, and a source region and a drain region of each of the first TFT and the second TFT comprises polycrystalline semiconductor.

* * * * *